(12) United States Patent
Simpson et al.

(10) Patent No.: US 9,202,783 B1
(45) Date of Patent: Dec. 1, 2015

(54) SELECTIVE ANTIPAD BACKDRILLING FOR PRINTED CIRCUIT BOARDS

(75) Inventors: Mark R. Simpson, Cupertino, CA (US); Joyce Kitabayashi, Cupertino, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 400 days.

(21) Appl. No.: 13/070,858

(22) Filed: Mar. 24, 2011

(51) Int. Cl.
*H01L 23/498* (2006.01)
*H01R 9/00* (2006.01)

(52) U.S. Cl.
CPC ............................... *H01L 23/49838* (2013.01)

(58) Field of Classification Search
CPC .................................................. H01L 23/49838
USPC ........... 361/760, 767, 777, 792–795; 174/260
See application file for complete search history.

(56) References Cited

U.S. PATENT DOCUMENTS

| | | | | | |
|---|---|---|---|---|---|
| 5,689,216 | A * | 11/1997 | Sturdivant | ........................ | 333/33 |
| 5,691,568 | A * | 11/1997 | Chou et al. | ..................... | 257/691 |
| 6,377,464 | B1 * | 4/2002 | Hashemi et al. | .............. | 361/760 |
| 6,392,160 | B1 * | 5/2002 | Andry et al. | ................... | 174/261 |
| 6,479,758 | B1 * | 11/2002 | Arima et al. | ................... | 174/260 |
| 7,102,892 | B2 * | 9/2006 | Kledzik et al. | ................ | 361/770 |
| 7,402,757 | B1 * | 7/2008 | Noujeim | ........................ | 174/261 |
| 7,999,192 | B2 * | 8/2011 | Chan et al. | .................... | 174/262 |
| 8,248,816 | B2 * | 8/2012 | Fung | ............................. | 361/794 |
| 8,325,459 | B2 * | 12/2012 | Mutnury et al. | .............. | 361/266 |
| 2005/0039950 | A1 * | 2/2005 | Chan et al. | .................... | 174/262 |
| 2006/0125072 | A1 * | 6/2006 | Mihara | .......................... | 257/686 |
| 2006/0151869 | A1 * | 7/2006 | Gisin et al. | .................... | 257/698 |
| 2006/0254809 | A1 * | 11/2006 | Kledzik et al. | ................ | 174/255 |
| 2007/0018752 | A1 * | 1/2007 | Miller | .............................. | 333/33 |
| 2007/0294890 | A1 * | 12/2007 | Gisin et al. | ...................... | 29/852 |
| 2008/0101050 | A1 * | 5/2008 | Fung | ............................. | 361/794 |
| 2008/0227311 | A1 * | 9/2008 | Chan et al. | ...................... | 439/74 |
| 2008/0283285 | A1 * | 11/2008 | Frech et al. | .................... | 174/261 |
| 2008/0318450 | A1 * | 12/2008 | Regnier et al. | .................. | 439/78 |
| 2009/0004501 | A1 * | 1/2009 | Tsai et al. | ...................... | 428/576 |
| 2009/0134528 | A1 * | 5/2009 | Lee et al. | ........................ | 257/777 |
| 2009/0166080 | A1 * | 7/2009 | Matsui | .......................... | 174/266 |
| 2009/0173532 | A1 * | 7/2009 | Sugane | ......................... | 174/262 |
| 2009/0188710 | A1 * | 7/2009 | Senk | ............................. | 174/262 |
| 2010/0193930 | A1 * | 8/2010 | Lee | ................................. | 257/686 |
| 2011/0132648 | A1 * | 6/2011 | Mutnury et al. | .............. | 174/260 |
| 2012/0000701 | A1 * | 1/2012 | Chan et al. | .................... | 174/266 |
| 2012/0199380 | A1 * | 8/2012 | Olsen | ........................... | 174/251 |
| 2012/0302075 | A1 * | 11/2012 | Muraoka et al. | ................ | 439/78 |

OTHER PUBLICATIONS

"PCB Fabrication—Backdrilling and Blind/Buried Via Formation"; Sanmina-SCI Corporation, 2010, 2 pages.

* cited by examiner

*Primary Examiner* — David M Sinclair
*Assistant Examiner* — Theron Milliser
(74) *Attorney, Agent, or Firm* — Harrity & Harrity, LLP

(57) ABSTRACT

A printed circuit board (PCB) may include antipads, used to provide clearance for backdrilling, which may be sized to allow backdrilling in a way that minimizes the presence of stubs. The PCB may include pads to connect a component to the PCB and vertically disposed vias connected to at least some of the pads. The PCB may further include horizontally disposed signal layers, electrically connected by the vias, to route signals from the component, received from the vias, to an edge of the component, in which signals associated with the component closer to an inner portion of the component are routed to the edge of the component on higher ones of the signal layers than signals associated with the component further from the inner portion of the component.

18 Claims, 10 Drawing Sheets

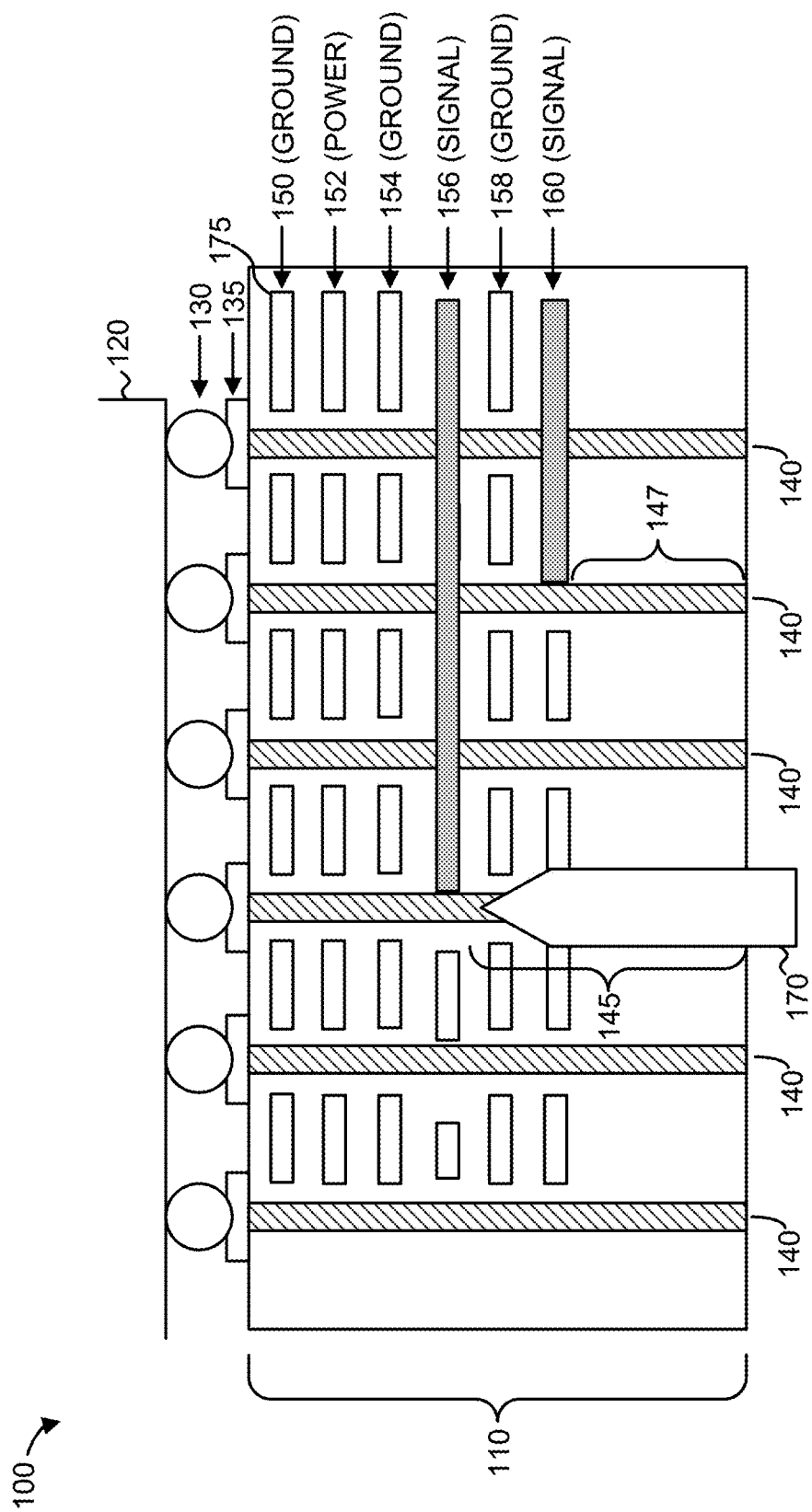

SELECTIVE ANTIPAD BACKDRILLING FOR PRINTED CIRCUIT BOARDS

BACKGROUND

A printed circuit board (PCB) may include one or more material layers that mechanically support and electrically connect electronic components using conductive pathways. The conductive pathways may be etched from copper sheets laminated onto a non-conductive substrate. The pathways may be organized as a number of layers on the PCB in order to increase the signal transmission density of the PCB. A PCB, after populating with electronic components, is commonly referred to as a printed circuit assembly (PCA).

PCBs may be used in high frequency applications. For example, a PCB may be populated with an integrated circuit used to enable high speed serial links to and from the PCB. In these situations, the PCB can experience significant signal integrity disturbances as a result of the unused portions of through-holes and vias, called stubs, that extend past the last connected layer of the PCB. The stubs can present resonances, impedance discontinuities, and increase the loss of the channel, thereby limiting performance.

For low density and low data rate serial links (e.g., <5 Gb/s), the signal lines are commonly routed on thin PCB substrates with Ball Grid Arrays (BGAs) connected to short vias, and can tolerate small stubs and present few challenges with power delivery. As the serial link speed and density increase, the PCB substrate thickness may be increased to accommodate more signal lines, which can in turn cause an increase in the stub length and a corresponding increase in signal integrity disturbances.

One technique for reducing stub length is known as backdrilling. Backdrilling is a controlled depth drilling (CDD) technique that removes stubs with numerically controlled drill equipment. In high density PCBs, backdrilling can be problematic because the clearance required for the drill bit may dictate that relatively large areas of metal conductive material, that could otherwise be used for signal lines or power distribution, must be removed. Backdrilling may thus limit the density of the PCB.

SUMMARY

One implementation may include a multilayer PCB that includes a pads to connect a component to the PCB; vertically disposed vias connected to at least some of the pads; and a number of horizontally disposed signal layers. The signal layers may be electrically connected by the vias, to route signals from the component, received from the vias, to an edge of the component, in which signals associated with the component closer to an inner portion of the component are routed to the edge of the component on higher ones of the signal layers than signals associated with the component further from the inner portion of the component. The multilayer PCB may further include a number of antipads formed in the layers and around the vias, in which the antipads include first antipads formed in the signal layers around a location in the vias below where the signals are routed to the edge of the component, and second antipads formed in the signal layer above where the signals are routed to the edge of the component, where the first antipads are larger than the second antipads.

In another implementation, a device may include pads to connect an integrated circuit to the device via a ball grid array (BGA); and vertically disposed vias connected to at least some of the pads. The device may also include a number of signal layers, electrically connected by the vias, to route signals from the integrated circuit, received from the vias, to an edge of the integrated circuit, in which signals associated with the integrated circuit closer to an inner portion of the BGA are routed to the edge of the integrated circuit on higher ones of the signal layers than signals associated with the integrated circuit further from the inner portion of the BGA. The device may further include at least one power layer, located above the plurality of signal layers.

In another implementation, a method may include fabricating a PCB to include pads on a top surface of the PCB; vertically disposed vias connected to at least some of the pads; a plurality of horizontally disposed signal layers, electrically connected by the plurality of vias, to route signals, received from the vias, to an edge of the plurality of pads, in which signals associated with pads closer to an inner portion of the plurality of pads are routed to the edge of the pads on first ones of the signal layers that are above second ones of the signal layers that route signals associated with pads further from the inner portion of the pads; and selectively sized antipads formed in the layers and around the vias, the selectively sized antipads including first antipads that are sized to accommodate drilling through the first antipads and second antipads that are smaller than the first antipads. The method may further include backdrilling the PCB, from a bottom surface of the PCB, to remove portions of the vias associated with the first antipads.

BRIEF DESCRIPTION OF THE DRAWINGS

The accompanying drawings, which are incorporated in and constitute a part of this specification, illustrate one or more implementations described herein and, together with the description, explain the invention. In the drawings, FIGS. 1A through 1C are diagrams of an example printed circuit assembly;

DETAILED DESCRIPTION

The following detailed description refers to the accompanying drawings. The same reference numbers in different drawings may identify the same or similar elements.

Techniques described herein relate to the layout of circuit boards to provide high speed (i.e., high frequency) signal paths. Antipads, which are used to provide clearance for backdrilling, may be selectively sized to allow backdrilling in a way that minimizes the presence of stubs. High speed signal lines on the inner rows of a component (e.g., an integrated circuit) may be routed away from the component above signal lines on rows closer to the edge of the component. Backdrilling may then be performed in a "stair-stepped" pattern from the inner row of the component to the outer row of the component.

Although the term "printed circuit board" will be generally used herein as an example of a substrate for electronic components, in alternative possible implementations, a PCB may be replaced with other substrates, such as, for example, rigid-flex circuits, semiconductor packages, multichip carrier modules (MCMs), micro electro mechanical systems (MEMS), ceramic circuits, midplanes, backplanes, and/or other types of substrates. Further, although the term "backdrilling" will be used herein to refer to drilling away of vias from the bottom of a PCB, other techniques for removing a portion of a via may alternatively be used, such as techniques based on a laser or optical "drill", etc.

Figure 1A:
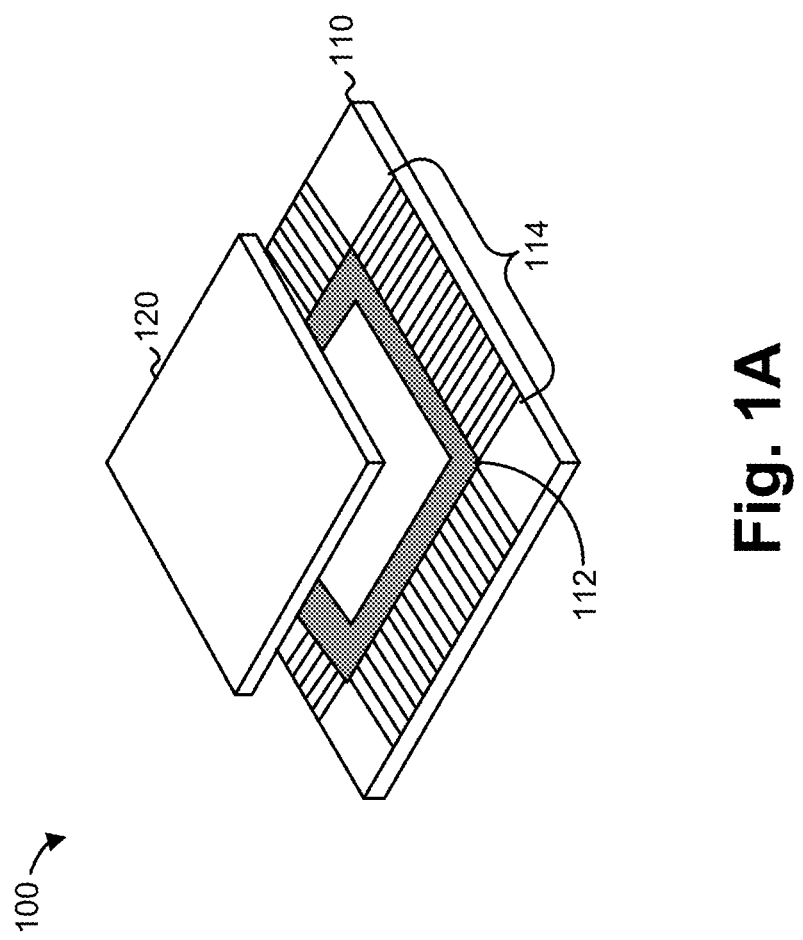
Figure 1C:
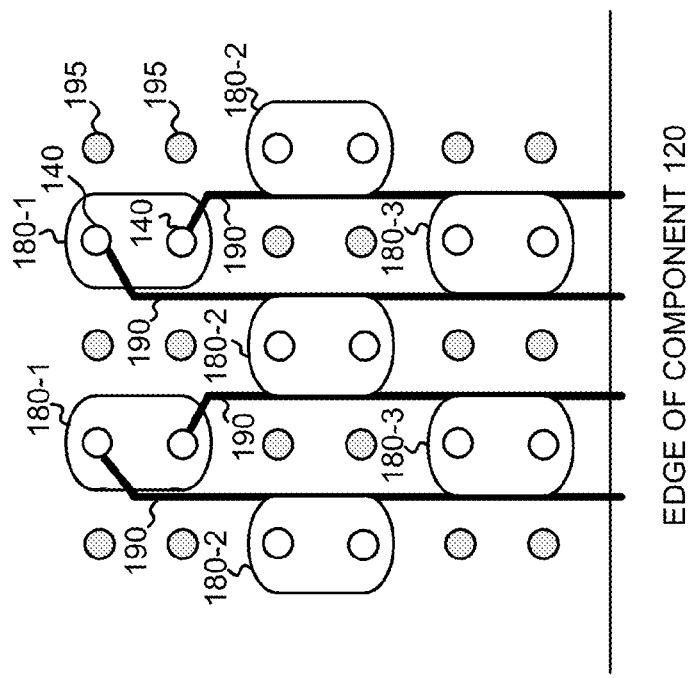

FIGS. 1A through 1C are diagrams of an example printed circuit assembly 100. As shown in FIG. 1A, a PCB 110 may be designed to hold one or more components, such as a component 120. Component 120 may include an integrated circuit (IC), such as an IC that is packaged using a BGA to contact PCB 110.

PCB 110 may include a laminate made of a number of alternating insulating and conductive layers. The conductive layers may be etched, or otherwise selectively fabricated, to include conductive paths through which signals and power may be transmitted. PCB 110 may be designed to hold component 120, such as by a surface mount technology (SMT) process.

PCB 110, as shown in FIG. 1, may include a portion of a complete circuit board or may connect to other components. In one implementation, PCB 110 may be part of a high speed, high density serial transmission system, such as a system that serially transmits data over other printed circuit boards, serial links over a midplane, or as one portion of a larger PCB. PCB 110 may include a contact area 112 and signal traces 114. Contact area 112 may include conductive pads onto which component 120 is physically secured. Signal traces 114 may include conductive signal paths through which signals may be passed. In one implementation, component 120 may facilitate a number of high speed serial communication signal paths. In this implementation, signal traces 114 may represent the serial communication lines that are routed, over PCB 110, to and from component 120.

Component 120 may include an integrated circuit, such as an application specific integrated circuit (ASIC) or a field-programmable Gate Array (FPGA), or other device that is secured to PCB 110 to create a portion of the logic of the final printed circuit assembly. Component 120 may include a BGA to implement the physical contact with PCB 110. The BGA may include a number of "ball" contacts that are designed to matchup with pads in contact area 112. In situations in which printed circuit assembly 100 implements high speed, high density serial connections, component 120 may include switching, routing, or buffering logic for serial communications.

FIG. 1B is a diagram illustrating a partial cross-section view of printed circuit assembly 100. The cross-section view shown in FIG. 1B conceptually illustrates a layout of PCB 110 as it relates to the connection of and routing of signals with component 120. As shown, component 120 is illustrated as connected to PCB 110 via a ball grid array 130. Ball grid array 130 may, for example, be soldered to pads 135 of PCB 110. In FIG. 1B, the right side of component 120 may represent the outer edge of component 120.

PCB 110 is shown as including a number of vias 140. A via 140 may generally be a vertical electrical connection between different layers of PCB 110. Each via 140 may include, at each layer, a pad that provides electrical connections between copper traces on the layer or an antipad that defines a non-conductive "void" around the via, to thus insulate the via from that layer. A number of example layers 150, 152, 154, 156, 158, and 160 are shown in PCB 110. Each layer 150-160 may include conductive traces (e.g., copper traces) that route power, signal, and/or ground communication paths through PCB 110. Each layer 150-160 may be generally electrically isolated from one another, but may be potentially connected through vias 140.

In some designs, it may be desirable to dedicate certain ones of layers 150-160 as power layers or ground layers. For example, as shown in FIG. 1B, ground layers 150, 154, and 158 are alternated between power layer 152 and signals layers 156 and 160. Signal layer 156 may route the innermost pair of signals from ball grid array 130 to the outer edge of component 120 and signal layer 160 may route the outer pair of signals from ball grid array 130 to the outer edge of component 120.

The portion of vias 140 that extend below the last layer to which the vias connect may create stubs. Stubs 145 and 147 are particularly labeled in FIG. 1B. Stubs 145 and 147 can create undesirable distortions in the signals that traverse the vias. The distortions may become more acute as the operating frequency increases. To decrease the deleterious affect of the stubs, the stubs may be backdrilled to physically remove the stub. A drill bit 170 is conceptually shown in FIG. 1B to illustrate the backdrilling of stub 145.

The rectangles shown in FIG. 1B, such as rectangle 175, for each of layers 150-160, may represent conductive traces for the layers. The breaks in the rectangles around vias 140 may define the antipads (i.e., non-conductive areas around a via 140). An antipad may function to isolate a via 140 from the PCB layer traversed by the via. When backdrilling, an antipad may be needed to provide a non-conductive clearance area for the drill bit. As the design density of PCB 110 increases, the antipad size required by the backdrilling process can become a limiting factor.

FIG. 1C is a diagram illustrating an example top view of PCB 110. In FIG. 1C, example antipads 180 and signal traces 190 are shown for a signal layer (e.g., signal layer 156).

As shown in FIG. 1C, antipads 180-1 through 180-3 are illustrated as ovals that surround vias 140. Each set of antipads 180-1 through 180-3 may correspond to a set of rows in ball grid array 130, of component 120, leading towards the edge of component 120. Antipads 180-1 may correspond to inner rows (i.e., towards the center of component 120), antipads 180-2 may correspond to the next set of rows closer to the edge of component 120, and antipads 180-3 may correspond to the set of rows closest to the edge of component 120. Signal traces 190 may be routed from vias 140 to the edge of component 120.

Ground vias 195 (shaded circles) are also shown in FIG. 1C. Ground vias 195 may connect to ground and may provide crosstalk isolation and well as vertical return current paths. For clarity, ground vias 195 are omitted from the discussion and illustrations that follow.

The size of antipads 180 may be dictated by the precision and accuracy of the drill used for backdrilling. As shown in FIG. 1C, antipads 180-2 through 180-3 overlap signal traces 190, which may degrade signal traces 190 and may undesirably cause impedance discontinuities.

Consistent with aspects described herein, antipads in a PCB design may be selectively sized to accommodate backdrilling. Signal paths through the PCB, which lead to the edge of a component on the PCB, may be arranged so that inner signal paths are routed on higher layers (i.e., layers closer to the "top" of the PCB, nearest to the mounting surface of component 120) of the PCB than outer signal paths.

Figure 2:
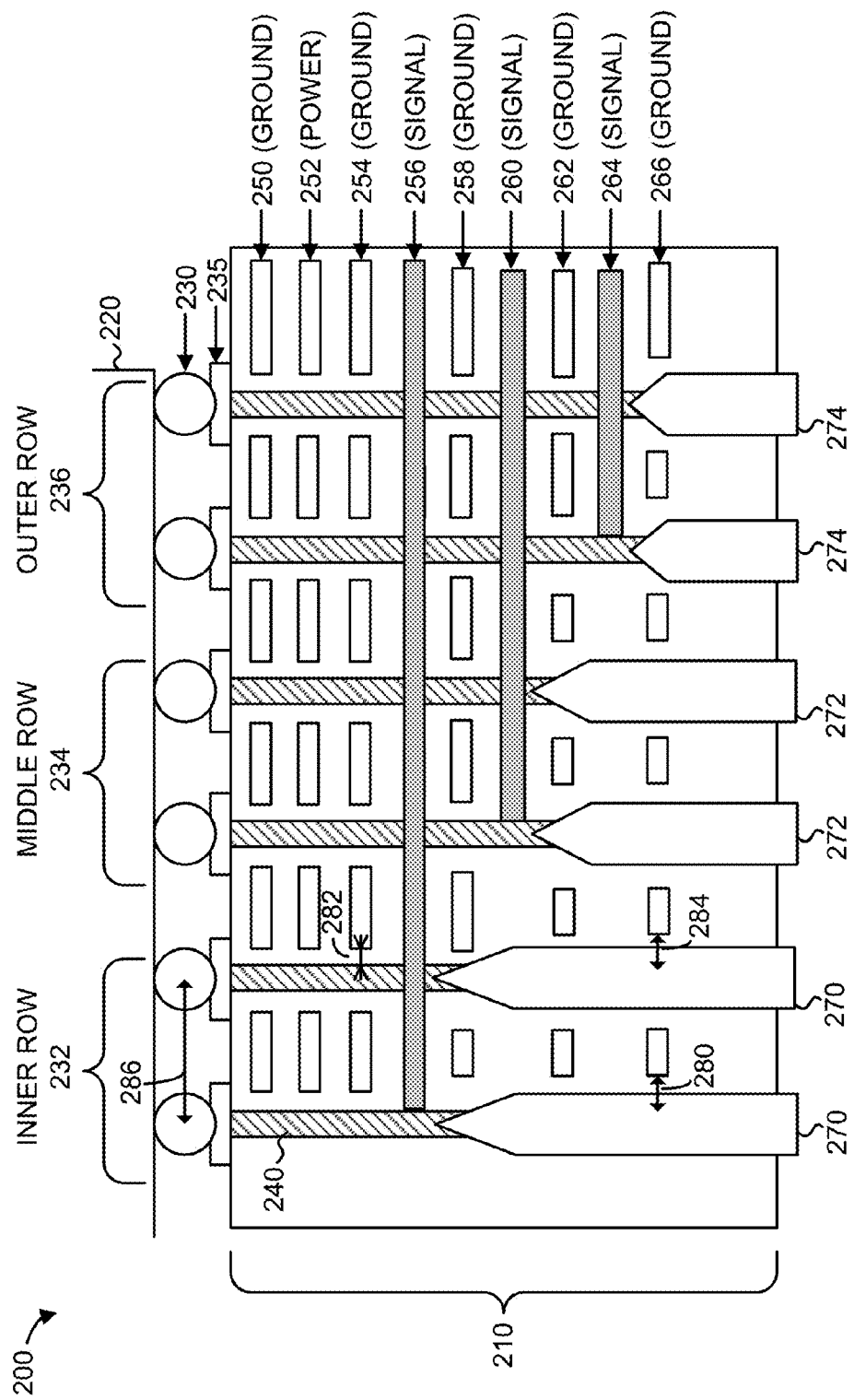
FIG. 2 is a diagram illustrating a partial cross-sectional view of an example printed circuit assembly.

FIG. 2 is a diagram illustrating a partial cross-sectional view of an example printed circuit assembly 200. Printed circuit assembly 200 may include a PCB 210. PCB 210 may include pads 235, onto which a component 220 is connected via a ball grid array 230 (e.g., through a surface mount process). PCB 210, component 220, and ball grid array 230 may generally correspond to PCB 110, component 120, and ball grid array 130, as described with respect to FIGS. 1A-1C. In FIG. 2, however, a selective antipad layout and sizing technique will be described. As shown in FIG. 2, PCB 210 may include a number of vertical vias 240 and horizontal layers 250-266.

In FIG. 2, the right side of component 220 may represent the outer edge of component 220. Three pairs of signal rows, labeled as inner row 232, middle row 234, and outer row 236 are illustrated. The three pairs of signal rows are shown for clarity and ease of explanation. In some implementations, component 220 may include more or fewer rows.

Vias 240 (shown with cross-hatching in FIG. 2) may vertically connect the different layers (layers 250-266) of PCB 210. Vias 240 may be selectively connected to layers 250-266.

A number of example layers 250, 252, 254, 256, 258, 260, 262, 264, and 266 are shown for PCB 210. Each layer 250-260 may include conductive traces (e.g., copper traces) that route power, signal, and/or ground communication paths through PCB 210. Each layer 250-266 may be generally electrically isolated from one another but potentially connected through vias 240. As shown, signal layer 256 may be connected to vias 240, which connect to inner row 232. Signal layer 260 may be connected to vias 240 associated with middle row 234, and signal layer 264 may be connected to vias 240 associated with outer row 236. Additional vias 240, such as vias 240 connecting ground layers 250, 254, 258, 262, and 266 to one another, to other layers, and to component 220; or vias 240 connecting power layer 252 to component 220 or to other layers, may be present but not shown in FIG. 2.

Ground layers 250, 254, 258, 262, and 266 may be arranged to be between each of the signal and power layers. Power layer 252 may be arranged to be above each of signal layers 256, 260, and 264.

Signal layers 256, 260, and 264 may be arranged to route the signals from vias 240 such that the innermost signal rows (i.e., inner row 232) are routed to the edge of component 220 before rows that are closer to the edge of component 220. Thus, signal layer 256, which is above signal layers 260 and 264, may route inner row 232 to the edge of component 220. Signal layer 260, which is below signal layer 256 and above signal layer 264, may route middle row 234 to the edge of component 220. Signal layer 264, which is below signal layers 256 and 260, may route outer row 236 to the edge of component 220.

By routing signal layers 256, 260, and 264 such that the innermost rows are routed to the edge of component 220 before outer rows, a "stair step" pattern is created in PCB 210 in which the lengths of the stubs monotonically decrease in the direction from inner row 232 to outer row 236. The stubs in FIG. 2 are illustrated by conceptual drill illustrations 270, 272, and 274. As illustrated, stubs 270, 272, and 274 become progressively shorter as stubs 270, 272, and 274 get closer to the edge of component 220. Backdrilling may be performed to remove stubs 270, 272, and 274.

In FIG. 2, antipads (non-conductive pads formed around vias 240) are defined by the non-conductive spaces between vias 240 and the conductive traces (illustrated as rectangles) in each of the signal layers. Example anti-pad radii are illustrated in FIG. 2 by distances 280, 282, and 284. Antipad distances for antipads that are to be backdrilled (e.g., antipads around drill illustrations 270, 272, 274) may be larger than antipad distances for antipads that are not backdrilled. For example, in one implementation, distances 280 and 284 may be approximately 17 mils (thousands of an inch) while distance 282 may be approximately 15 mils. The increased size for the antipads that are to be backdrilled may be necessary to accommodate the tolerances required by the drilling operation. In general, the values for the distance given herein (e.g., distances 280, 282, and 284) may be based on the pitch of the ball grid array. Having distance 280 of 17 mils and distance 282 of 15 mils may correspond to a ball grid array pitch of approximately 40 mils. The ball grid array pitch is illustrated in FIG. 2 as distance 286.

FIG. 2 illustrates one example design for PCB 210. In alternative implementations, PCB 210 may include, for example, different quantities/sizes of vias, different quantities of layers, different quantities/arrangements of ball grid contacts, etc.

FIGS. 3A-3D are diagrams illustrating example top views of PCB 210. Each of FIGS. 3A-3D may illustrate elements of PCB 210 at a different layer or layers of PCB 210.

Figure 3A:
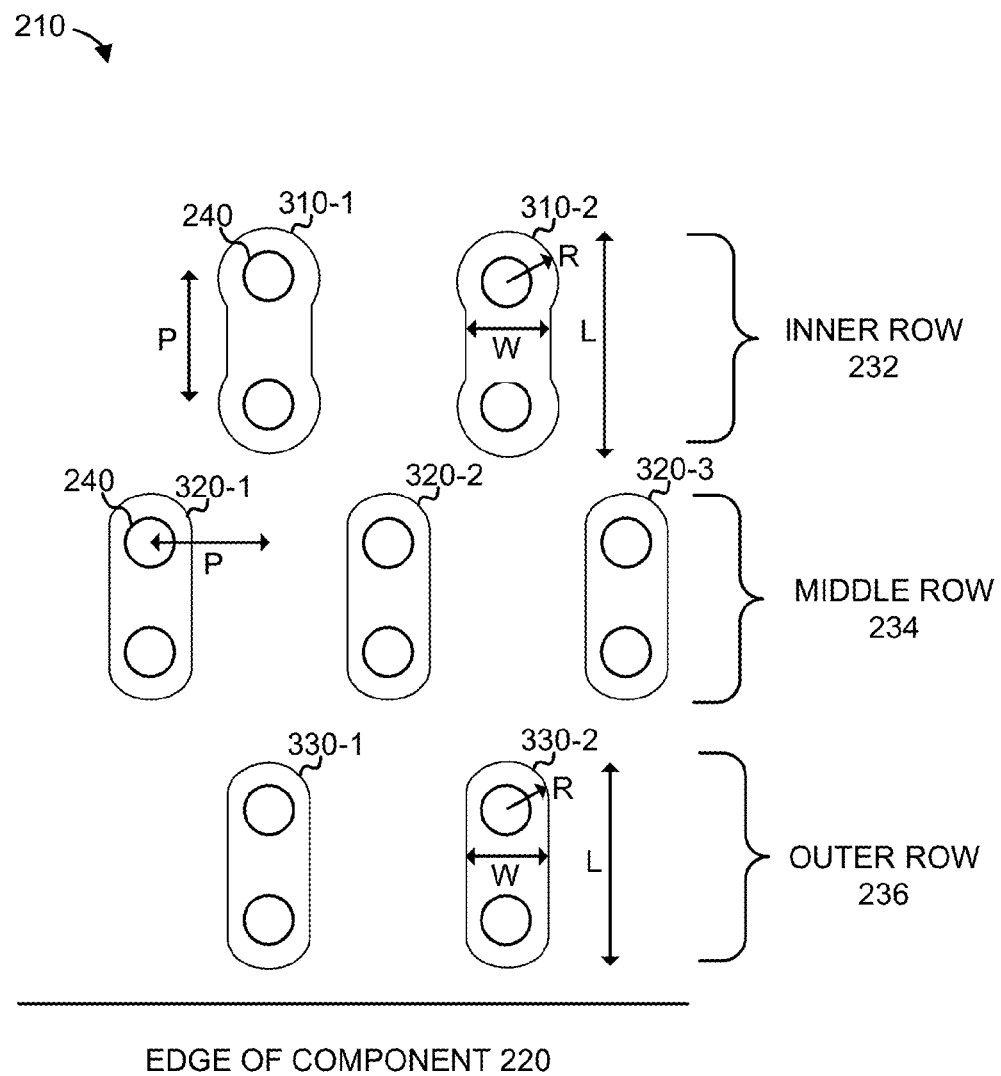
FIGS. 3A-3D are diagrams illustrating example top views of a PCB.

FIG. 3A is a diagram illustrating an example partial top view of PCB 210. In FIG. 3A, selective antipad sizing is illustrated in one or more layers below signal layer 256, such as ground layer 258 and signal layer 260.

Antipads 310, 320, and 330 are shown in FIG. 3A. Antipads 310-1 and 310-2 may include antipads surrounding vias 240 in inner row 232. Antipads 320-1, 320-2, and 320-3 may include antipads surrounding vias 240 in middle row 234. Antipads 330-1 and 330-2 may include antipads surrounding vias 240 in outer row 236.

Antipads 310-1 and 310-2, which may be subject to backdrilling, may each include a relatively large antipad area (non-conductive void area) surrounding vias 240. The pitch, P, of the ball grid array is also shown in FIG. 3A. In the example shown, antipads 310-1 and 310-2 include ovals with rounded portions around vias 240. In one example implementation, the width of antipads 310-1 and 310-2 across the narrow portion of the antipad (shown as W in antipad 310-2) may be approximately 30 mils. The radius (shown as R in antipad 310-2) may be approximately 17 mils. The length of antipads 310 (shown as L in antipad 310-2) may be approximately 74 mils.

Antipads 320-1, 320-2, 320-3, 330-1, and 330-2, which are not subject to backdrilling, may each include a smaller antipad (i.e., antipad area) than the area of antipads 310. A smaller area may be possible because these antipads do not have to be given tolerances related to the precision/accuracy of the backdrilling operation. Additional conductive material outside of the antipad void can be left in the layer and used for signal routing, power distribution, ground distribution, etc. In the example shown, antipads 320 and 330 may be oval shaped, in which the width of antipads 320 and 330 (shown as W in antipad 330-2) may be approximately 30 mils; the radius (shown as R in antipad 330-2) may be approximately 15 mils; and the length of antipads 320 and 330 (shown as L in antipad 330-2) may be approximately 70 mils.

Figure 3B:
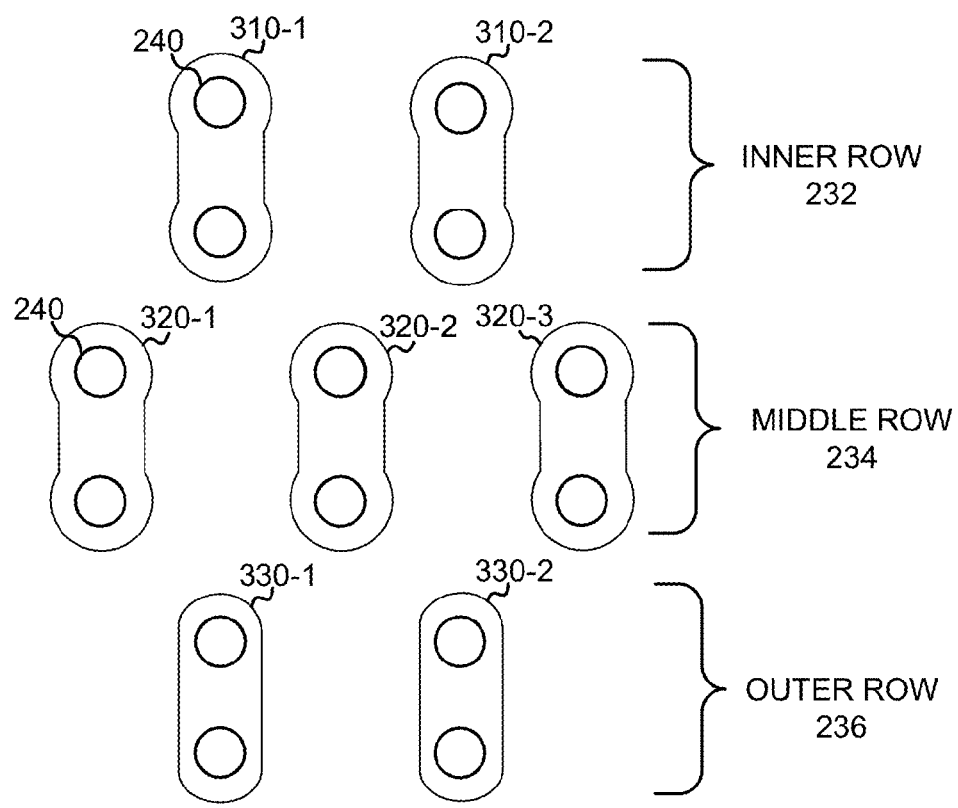

FIG. 3B is a conceptual diagram illustrating a partial top view of PCB 210. The view of FIG. 3B illustrates selective antipad sizing in one or more layers below signal layer 260, such as ground layers 262 and 266.

FIG. 3B is similar to FIG. 3A. In FIG. 3B, however, antipads 320 include the larger antipad area to accommodate backdrilling. Thus, in FIG. 3B, backdrilling may be performed through antipads 310 and 320. Antipads 330 may correspond to antipads above or at the bottom signal layer (i.e., signal layer 264). Antipads 330 may be smaller than antipads 310 and 320, potentially leaving more conductive material around antipads 330.

Figure 3C:
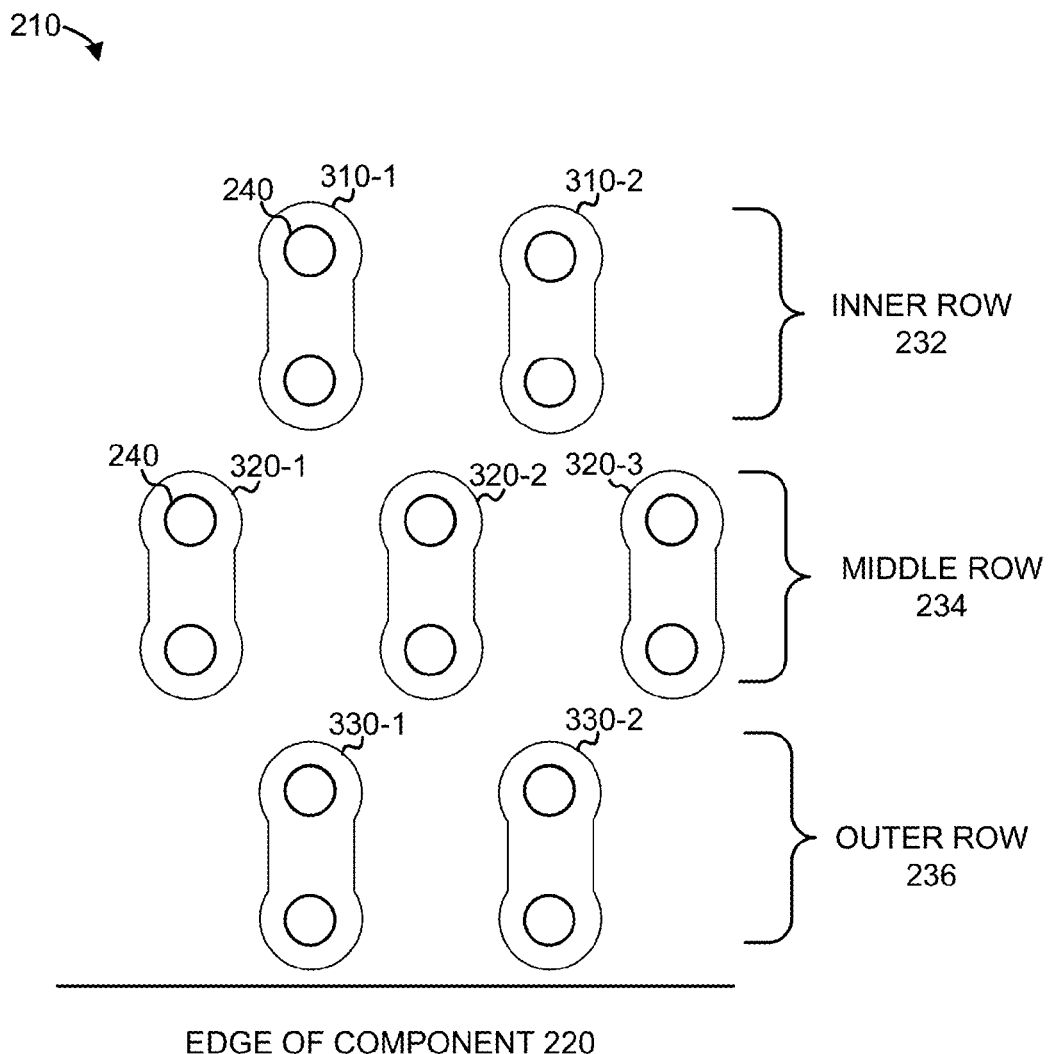

FIG. 3C is a conceptual diagram illustrating a partial top view of PCB 210. The view of FIG. 3C illustrates selective antipad sizing in one or more layers below signal layer 264, such as ground layer 266.

FIG. 3C is similar to FIGS. 3A and 3B. In FIG. 3C, however, antipads 310, 320, and 330 all include a larger antipad area to accommodate backdrilling. Thus, backdrilling may be performed through antipads 310, 320, and 330.

Figure 3D:
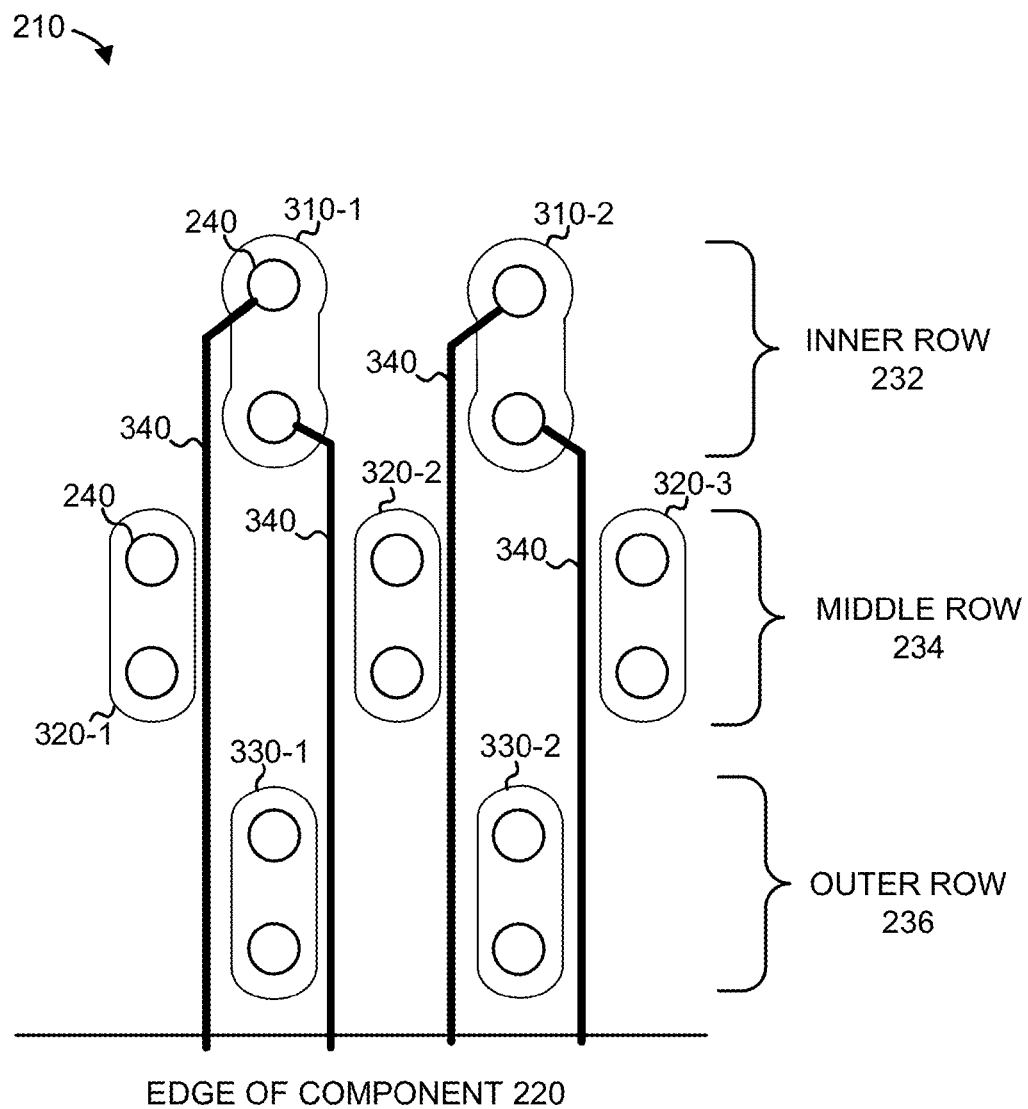

FIG. 3D is a conceptual diagram illustrating a partial top view of PCB 210. The view of FIG. 3D is similar to FIG. 3A except that signal paths 340 in signal layer 256 are shown in FIG. 3D. As illustrated, and in contrast to FIG. 1C, because antipads 320 and 330 are smaller antipads than antipads 310, additional clearance around antipads 320 and 330 is available for signal paths 340.

Although FIGS. 3A-3D illustrate oval shaped antipads, in alternative implementations, the antipads may be of other shapes or other sizes. In one possible implementation, for example, instead of connecting adjacent vias using an oval antipad, the antipad surrounding each via may be independent, such as a circle surrounding each via, in which the independent antipads may be selectively sized.

Figure 4:
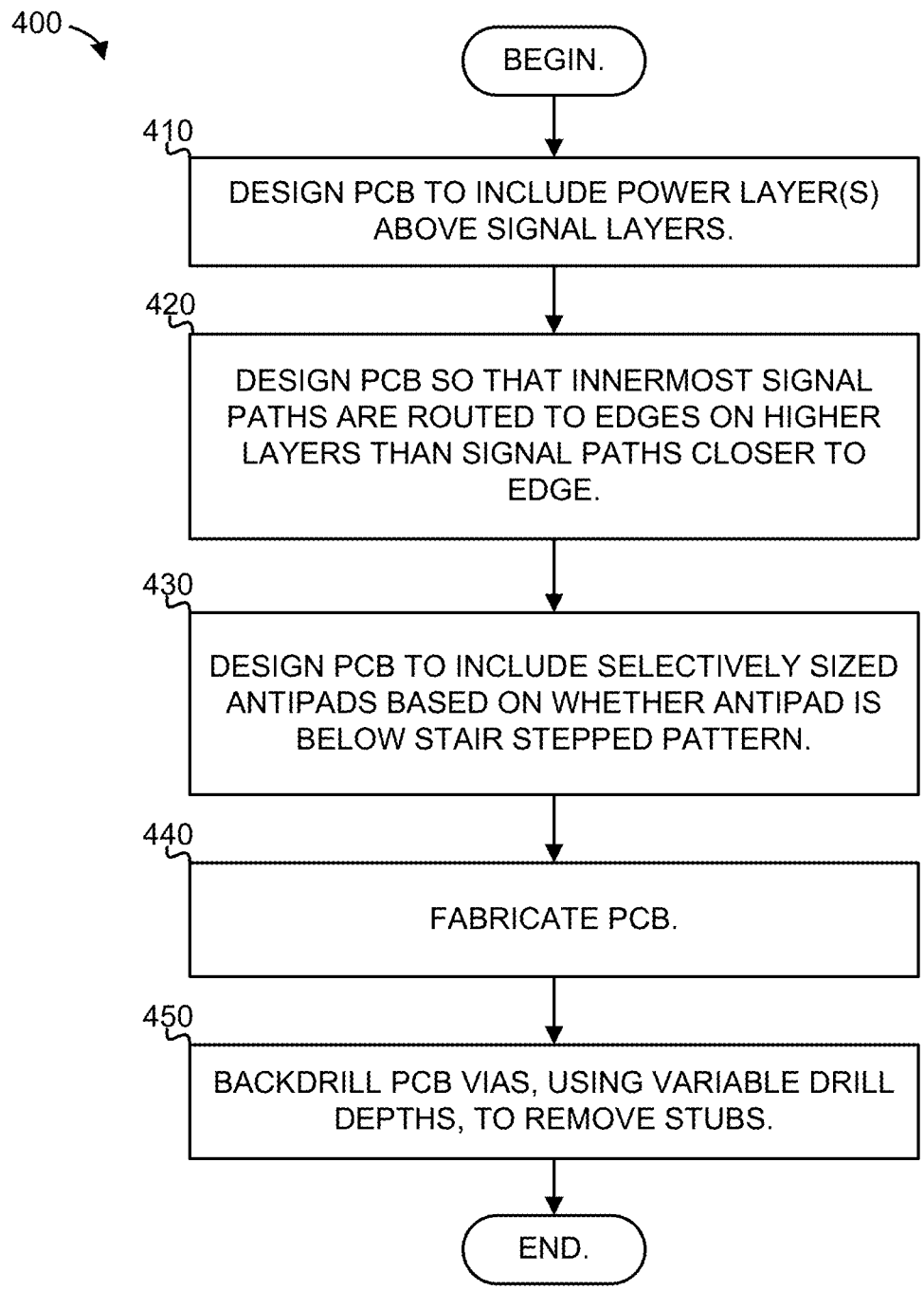
FIG. 4 is a flow chart illustrating an example process for creating a PCB using selective antipad sizing.

FIG. 4 is a flow chart illustrating an example process 400 for creating a PCB using selective antipad sizing. Process 400 may be applied to the design of a PCB used to route a number of high speed serial signals.

Process 400 may include designing the PCB to include one or more power layers above signal layers of the PCB (block 410). By including the power layers above the signal layers, small antipads can be used around vias in the power layer. The smaller antipads may allow for more metal in the power plane, potentially improving the effectiveness of the power delivery layer.

Process 400 may further include designing the PCB so that the innermost signal paths, corresponding to the component (s) on the PCB, are routed to the edge(s), of component 220, through higher layers on the PCB than signal paths closer to the edges of component 220 (block 420). As shown in FIG. 2, for instance, inner row 232 may be routed to the edge of component 220 before middle row 234, which may be routed to the edge of component 220 before outer row 236. As a result of this routing technique, a stair step pattern may be formed in the side view shown in FIG. 2.

Process 400 may further include designing the PCB to include selectively sized antipads based on whether an antipad is below a stair stepped pattern (block 430). Antipads above or at the stair stepped pattern may be smaller sized antipads. Antipads below the stair stepped pattern may include a larger sized antipad. The smaller sized antipads may be determined as a size needed to isolate the via from layers through which the via passes. The larger sized antipads may be determined as a size needed to isolate the via and provide space for backdrilling through the antipad. As shown in FIG. 3A, in one possible implementation, smaller antipads, such as antipads 320 and 330, may include oval shaped antipads that each cover two vias 240. Larger antipads, such as antipads 310, may be similar to the smaller antipads but may include an enlarged circular region around the vias 240.

Process 400 may further include fabricating the designed PCB (block 440). Fabricating the PCB may be performed using conventional techniques, such as by performing a multi-layer copper etching to produce the PCB.

Process 400 may further include backdrilling the vias in the PCB, using variable drill depths, to remove via stubs (block 450). The backdrilling operation may include using a computer controlled drill to remove, from the bottom of PCB 210, vias 240 in PCB 210. The vias may be removed up to the depth corresponding to all of the larger antipads surrounding a particular via 240. In FIG. 2, for example, for inner row 232, the larger antipads are illustrated in layers 258-266. Drill 270 may drill into PCB 210 through the depth of ground layer 258. For middle row 234, the larger antipads are illustrated as being used in layers 262-266. Drill 272 may drill into PCB 210 through the depth of ground layer 262. For outer rows 236, drill 274 may drill into PCB 210 up through the ground layer 266. In alternative implementation, instead of placing the components (e.g., component 220) on top of PCB 240 and backdrilling from the bottom, the components may be placed on the bottom of PCB 240 and backdrilling may be performed from the top of PCB 240.

Figure 5B:
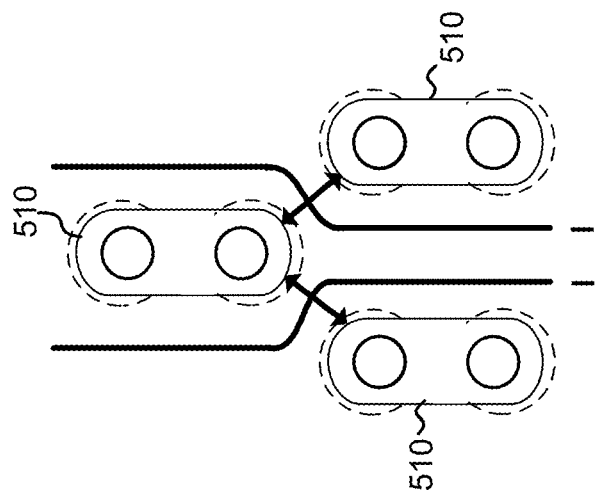
FIGS. 5A and 5B are conceptual diagrams illustrating potential features of selective antipad backdrilling.
Figure 5A:
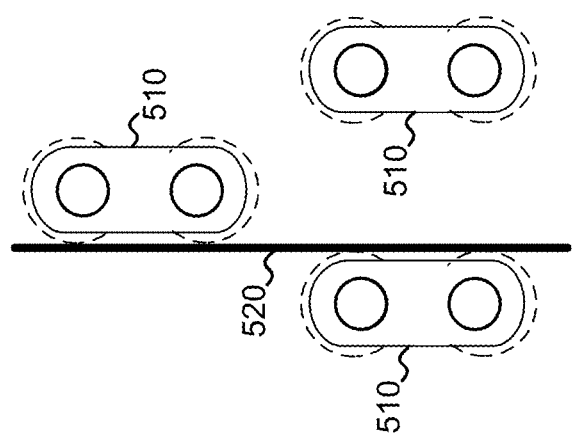

FIGS. 5A and 5B are conceptual diagrams illustrating potential features of selective antipad backdrilling, as described above. As shown in FIGS. 5A and 5B, antipads 510 are illustrated as ovals, in which the smaller versions of the antipads are shown with solid lines and the larger versions of the antipads with dashed lines. As discussed previously, the smaller version of antipads 510 may be used in signal layers. In FIG. 5A, a signal line 520, which may be routed in a signal layer with the smaller versions of the antipads, avoids the partial loss of reference that may otherwise occur if a signal line were routed through a layer using the larger version of antipads 510. With the smaller version of the antipads, the clearance from signal line 520 to the void formed by an antipad 510 may be, for example, approximately 2.5 mils.

In FIG. 5B, the power plane (power layer 252) is illustrated. In the power plane, the smaller version of antipads 510 may be used. Advantageously, additional area may be devoted to conductive metal, which can result in improved power distribution (as shown by the arrows). This can be advantageous for high current devices.

As described herein, antipads in a PCB may be selectively sized and backdrilled to minimize via stub length. A number of features may be realized with the technique described herein. For example, smaller antipads may increase the metal area that can be used for power and signal delivery. Additionally, backdrilling may be performed through layers adjacent to the signal layers from which the signal is routed away from the PCB component, thus reducing distortions caused by via stubs. The technique described herein can maintain good signal reference and minimize impedance discontinuities. Further, using the upper layers, which include smaller antipads, for power delivery, may result in lower current densities and improved IR (voltage) drop margin.

While a series of blocks has been described in FIG. 4, the order of the blocks may vary in other implementations. Also, non-dependent blocks may be performed in parallel.

Even though particular combinations of features are recited in the claims and/or disclosed in the specification, these combinations are not intended to limit the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

Further, certain aspects described herein may be implemented as "logic" or as a "component" that performs one or more functions. This logic or component may include hardware, such as an ASIC or a FPGA, or a combination of hardware and software.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise. The scope of the invention is defined by the claims and their equivalents.

What is claimed is:

1. A printed circuit board (PCB) comprising:
a plurality of pads to connect a component to the PCB;
a plurality of vertically disposed vias connected to at least some of the plurality of pads;
a plurality of horizontally disposed signal layers that create a stair step pattern in the PCB and are electrically connected by the plurality of vertically disposed vias,
the plurality of horizontally disposed signal layers being to route signals from the component, received from the plurality of vertically disposed vias, to an edge of the component,
the plurality of horizontally disposed signal layers including:
first signal layers,
second signal layers, and
third signal layers,
the first signal layers being higher than the second signal layers,
the second signal layers being higher than the third signal layers,
the signals including:
first signals that are associated with an inner row of the component,
second signals that are associated with a middle row of the component, and
third signals that are associated with an outer row of the component,
the inner row being closer to an inner portion of the component than the outer row,
the first signals being routed to the edge of the component on the first signal layers that are higher than the second signal layers,
the second signals being routed to the edge of the component on the second signal layers that are higher than the third signal layers, and
the third signals being routed to the edge of the component on the third signal layers;
a plurality of antipads formed in the plurality of horizontally disposed signal layers and around the plurality of vertically disposed vias,
the plurality of antipads including:
first antipads that are formed around a location in the plurality of vertically disposed vias that is below where the signals are routed to the edge of the component, and
second antipads that are formed in the signal layers above where the signals are routed to the edge of the component, and
the first antipads being larger than the second antipads;
a first area formed by first backdrilling from a bottom of the PCB up to the first signal layers and through a first via of the plurality of vertically disposed vias;
a second area formed by second backdrilling from the bottom of the PCB up to the second signal layers and through a second via of the plurality of vertically disposed vias; and
a third area formed by third backdrilling from the bottom of the PCB up to the third signal layers and through a third via of the plurality of vertically disposed vias,
the first area, the second area, and the third area being in the stair step pattern,
the first backdrilling, the second backdrilling, and the third backdrilling forming via stubs in the PCB,
lengths of the via stubs decreasing in a direction from the inner row of the component to the outer row of the component, and
the via stubs including:
first two via stubs that are formed during the first backdrilling,
second two via stubs that are formed during the second backdrilling,
the second two via stubs being closer to the edge of the component than the first two via stubs, and
the second two via stubs being shorter than the first two via stubs,
and
third two via stubs that are formed during the third backdrilling,
the third two via stubs being closer to the edge of the component than the second two via stubs and the first two via stubs, and
the third two via stubs being shorter than the second two via stubs and the first two via stubs.

2. The PCB of claim 1, further comprising:
at least one power layer that is located above the plurality of horizontally disposed signal layers,
the power layer including the second antipads.

3. The PCB of claim 1, where the plurality of antipads are formed around two vias of the plurality of vertically disposed vias.

4. The PCB of claim 1,
where the plurality of vertically disposed vias include particular vias that are contained in the first antipads,
where the particular vias are backdrilled during the first backdrilling, the second backdrilling, and the third backdrilling, and
where the particular vias include one or more of the first via, the second via, or the third via.

5. The PCB of claim 1, where the component connects to the PCB via a ball grid array.

6. The PCB of claim 1, where the component includes an integrated circuit (IC).

7. A device comprising:
a plurality of pads to connect an integrated circuit to the device via a ball grid array (BGA);
a plurality of vertically disposed vias connected to at least some of the plurality of pads;
a plurality of signal layers that create a stair step pattern in the device and are electrically connected by the plurality of vertically disposed vias,
the plurality of signal layers being to route signals from the integrated circuit, received from the plurality of vertically disposed vias, to an edge of the integrated circuit,
the plurality of signal layers including:
first signal layers,
second signal layers, and
third signal layers,
the first signal layers being higher than the second signal layers,
the second signal layers being higher than the third signal layers,
the signals including:
first signals that are associated with an inner row of the integrated circuit,
second signals that are associated with a middle row of the integrated circuit, and third signals that are associated with an outer row of the integrated circuit, the inner row being closer to an inner portion of the BGA than the outer row, and the first signals being routed to the edge of the integrated circuit on the first signal layers that are higher than the second signal layers, the second signals being routed to the edge of the integrated circuit on the second signal layers that are higher than the third signal layers, and the third signals being routed to the edge of the integrated circuit on the third signal layers;

at least one power layer that is located above the plurality of signal layers;

a first area formed by first backdrilling of a first via, of the plurality of vertically disposed vias, from a bottom of the device and up to the first signal layers;

a second area formed by second backdrilling of a second via, of the plurality of vertically disposed vias, from the bottom of the device and up to the second signal layers; and a third area formed by third backdrilling of a third via, of the plurality of vertically disposed vias, from the bottom of the device and up to the third signal layers, the first area, the second area, and the third area being in the stair step pattern, the first area including first two via stubs, the second area including second two via stubs, the second two via stubs being closer to the edge of the integrated circuit than the first two via stubs, and the second two via stubs being shorter than the first two via stubs, and the third area including third two via stubs, the third two via stubs being closer to the edge of the integrated circuit than the second two via stubs and the first two via stubs, and the third two via stubs being shorter than the second two via stubs and the first two via stubs.

8. The device of claim 7, further comprising:

a plurality of first antipads formed in the plurality of signal layers and around first vias of the plurality of vertically disposed vias, the first vias being above where the signals are routed to the edge of the integrated circuit; and a plurality of second antipads formed in the plurality of signal layers and around second vias of the plurality of vertically disposed vias, the second vias being below where the signals are routed to the edge of the integrated circuit.

9. The device of claim 8, where sizes of the plurality of second antipads are based on tolerances required for backdrilling through the second vias.

10. The device of claim 8, where the plurality of first antipads and the plurality of second antipads include conductive voids formed in a generally oval or circular pattern.

11. The device of claim 7, further comprising:

a plurality of antipads that are formed around two vias of the plurality of vertically disposed vias.

12. The device of claim 8, where lengths of portions of the second vias monotonically decrease in a direction from the inner portion of the BGA to an outer portion of the BGA.

13. The device of claim 7, where the device includes a printed circuit board (PCB).

14. The device of claim 7, where the signal layers are designed for high speed serial links.

15. The PCB of claim 1, where the first two via stubs are in the inner row of the component, where second two via stubs are in the middle row of the component, and where the third two via stubs are in the outer row of the component.

16. A method comprising:

fabricating a printed circuit board (PCB) to include:

a plurality of pads to connect a component to the PCB, a plurality of vertically disposed vias connected to at least some of the plurality of pads, a plurality of horizontally disposed signal layers that create a stair step pattern in the PCB and electrically connected by the plurality of vias, the plurality of horizontally disposed signal layers being to route signals from the component, received from the plurality of vertically disposed vias, to an edge of the component, the plurality of horizontally disposed signal layers including:

first signal layers, second signal layers, and third signal layers, the first signal layers being higher than the second signal layers, the second signal layers being higher than the third signal layers, the signals including:

first signals that are associated with an inner row of the component, second signals that are associated with a middle row of the component, and third signals that are associated with an outer row of the component, the inner row being closer to an inner portion of the component than the outer row, the first signals being routed to the edge of the component on the first signal layers that are higher than the second signal layers, the second signals being routed to the edge of the component on the second signal layers that are higher than the third signal layers, and the third signals being routed to the edge of the component on the third signal layers, and a plurality of antipads formed in the plurality of horizontally disposed signal layers and around the plurality of vertically disposed vias, the plurality of antipads including:

first antipads that are formed around a location in the plurality of vertically disposed vias that is below where the signals are routed to the edge of the component, and second antipads that are formed in the signal layers above where the signals are routed to the edge of the component, and the first antipads being larger than the second antipads; and backdrilling the PCB, from a bottom surface of the PCB up to the first signal layers and through a first via of the plurality of vertically disposed vias, to form a first area;

backdrilling the PCB, from the bottom surface of the PCB up to the second signal layers and through a second via of the plurality of vertically disposed vias, to form a second area; and backdrilling the PCB, from the bottom surface of the PCB up to the third signal layers and through a third via of the plurality of vertically disposed vias, to form a third area, the first area, the second area, and the third area being in the stair step pattern, the first area, the second area, and the third area including via stubs in the PCB, lengths of the via stubs decreasing in a direction from the inner row of the component to the outer row of the component, and the via stubs including:
- first two via stubs that are in the first area,
- second two via stubs that are in the second area,
  - the second two via stubs being closer to the edge of the component than the first two via stubs, and
  - the second two via stubs being shorter than the first two via stubs, and
- third two via stubs that are in the third area,
  - the third two via stubs being closer to the edge of the component than the second two via stubs and the first two via stubs, and
  - the third two via stubs being shorter than the second two via stubs and the first two via stubs.

17. The method of claim 16, further comprising:

attaching an integrated circuit to the plurality of pads, the integrated circuit including facilitating high speed serial links.

18. The method of claim 16, where the PCB is further fabricated to include a horizontally disposed power layer located above the plurality of horizontally disposed signal layers.

* * * * *